United States Patent
Choi et al.

(10) Patent No.: US 8,730,311 B2
(45) Date of Patent: May 20, 2014

(54) MANUFACTURING DEVICE OF A FILM PATTERNED RETARDER FOR A THREE DIMENSIONAL DISPLAY DEVICE

(75) Inventors: Yongbum Choi, Gyeonggi-do (KR); Jongryul Choi, Gyeonggi-do (KR); Jaeyeol Heo, Gyeonggi-do (KR); Sunghoon Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 305 days.

(21) Appl. No.: 13/329,664

(22) Filed: Dec. 19, 2011

(65) Prior Publication Data
US 2012/0212714 A1    Aug. 23, 2012

(30) Foreign Application Priority Data
Feb. 21, 2011   (KR) .................. 10-2011-0014912

(51) Int. Cl.
*H04N 13/04*    (2006.01)
*H04N 15/00*    (2006.01)
*G02B 5/30*    (2006.01)
*G02B 27/26*    (2006.01)
*G02F 1/13363*    (2006.01)

(52) U.S. Cl.
CPC .............. *G02B 5/3083* (2013.01); *G02B 27/26* (2013.01); *G02B 5/3016* (2013.01); *G02F 1/13363* (2013.01)
USPC ............................................ 348/58; 348/42

(58) Field of Classification Search
CPC .... G02B 5/3083; G02B 27/26; G02B 5/3016; G02F 1/13363
USPC ................ 348/42, 43, 46, 48, 51, 52, 57, 58; 355/53
See application file for complete search history.

(56) References Cited

U.S. PATENT DOCUMENTS 6,072,566 A * 6/2000 Fujii et al. .................... 356/15
2003/0137626 A1 7/2003 Khazova et al.

FOREIGN PATENT DOCUMENTS

| CN | 1432828 A | 7/2003 |
|---|---|---|
| CN | 1618032 A | 5/2005 |
| WO | 03060578 A1 | 7/2003 |

OTHER PUBLICATIONS

Office Action dated Jan. 6, 2014, issued by the State Intellectual Property Office of China in Chinese Patent Application No. 201110439678.6.

* cited by examiner

*Primary Examiner* — Robert Chevalier
(74) *Attorney, Agent, or Firm* — Morgan, Lewis & Bockius LLP

(57) ABSTRACT

The present disclosure relates to a manufacturing device of a film patterned retarder for a three dimensional display devices. The present disclosure suggests a device for manufacturing a film patterned retarder comprising: a light source configured to irradiate an ultra violet light to an exposure area; a left polarizer and a right polarizer disposed in neighboring on a same leveled plane within the exposure area; a left pattern mask overlapping with the left polarizer and a right pattern mask overlapping with the right polarizer; and a film roller configured to rotate with a constant speed, to contact a base film on its surface and to move the base film with the constant speed. The manufacturing process is very simple and the cost for manufacturing the film patterned retarder according to the present disclosure is saved.

16 Claims, 3 Drawing Sheets

MANUFACTURING DEVICE OF A FILM PATTERNED RETARDER FOR A THREE DIMENSIONAL DISPLAY DEVICE

This application claims the benefit of Korea Patent Application No. 10-2011-0014912 filed on Feb. 21, 2011, which is incorporated herein by reference for all purposes as if fully set forth herein.

BACKGROUND OF THE INVENTION

1. Field of the Invention

The present disclosure relates to a manufacturing device of a film patterned retarder for a three dimensional display devices. Especially, the present disclosure relates to a manufacturing device for a film type patterned retarder in which the left polarization exposure and the right polarization exposure are performed at different areas, respectively, using the single photo aligning step.

2. Discussion of the Related Art

Recently, thank to the advancement of the various video contents, the display devices which can selectively reproduce 2D images and 3D images are actively developed. For reproducing the 3D images, the display uses the stereoscopic technique or the autostereoscopic technique.

The stereoscopic technique uses the binocular parallax caused by the human two eyes apart from each other. There are typically two types; one is the glasses type and the other is non-glasses type. For the glasses type, the display device displays the left eye image and the right eye image in different polarization directions or in time division manner. The observer can enjoy the 3D images using the polarization glasses or the liquid crystal shutter glasses. For the non-glasses type, an optical plate such as a parallax barrier for separating an optical axis of the parallel image between the left eye and the right eye is installed in front of or behind of a display screen.

In the 3D display system using the glass type stereoscopic technique, for one example, the polarization glasses type includes a display panel attaching the polarization selecting element such as the patterned retarder on its surface. The patterned retarder is used for setting the polarization directions of the right eye image and the left eye image represented at the same time on the display panel in different from each other. In the polarization glasses type 3D display system, the viewer shall wear the polarization glasses for enjoying the 3D images. The left eye image can be reached to the left eye of the viewer through the left filter of the polarization glasses while the right eye image can be reached to the right eye of the viewer through the right filter of the polarization glasses.

On the other hands, in the 3D display system using the shutter glasses type stereoscopic technique, the display panel represents the left eye image and the right eye image in different time period. In the shutter glasses type 3D display system, the viewer shall wear the shutter glasses for enjoying the 3D images. During the left eye image activation period, the left eye shutter of the shutter glasses is opened only, while the right eye shutter is opened during the right eye image activation period.

As the shutter glasses type 3D display system does not need to have the polarization selecting element attached on the display panel, the price of the display panel is not expensive. However, as the shutter glasses are very expensive, the cost for configuring the whole 3D system is expensive. In the aspect of the 3D video quality, as the shutter glasses type uses the time division method in which the left eye image and the right eye image are represented in different time periods, it cannot be free from the problems of the flickers and the 3D cross-talks.

On the contrary, as the polarization glasses type has to have the polarization selecting element such as the patterned retarder, the price of the display panel shall be expensive somewhat. However, as the polarization glasses type uses the polarization glasses which are much cheaper than shutter glasses, the cost for configuring the whole 3D system is cheaper than that of the shutter glasses type. Furthermore, in the aspect of the 3D video quality, the left eye image and the right eye image are represented at the same time frame and they are divided line by line. Therefore, it may have a lower density than that of the shutter glasses type, but it has the less problem of the flickers and the 3D cross-talks than that of the shutter glasses type.

There are typically two types of the patterned retarder; one is the glass patterned retarder (or "GPR") in which the patterned retarder is formed on the glass substrate and the other is the film patterned retarder (or "FPR") in which the patterned retarder is formed on the film substrate. Recently, the film patterned retarder is mostly used because it is thinner, lighter and cheaper than the glass patterned retarder.

According to the currently used method, to make the film patterned retarder is very difficult and it is hard to configure the manufacturing devices because at each tiny area corresponding to the pixel area shall have individual pattern of the patterned retarder. Furthermore, in order to make a large area film patterned retarder, it is required to configure expensive and complex manufacturing devices. Therefore, nowadays, it is required to develop a simply structured manufacturing device for the film patterned retarder using the simplified manufacturing steps.

SUMMARY OF THE INVENTION

In order to overcome the above mentioned drawbacks, the purpose of the present disclosure is to suggest a manufacturing device of a film patterned retarder for a three dimensional display devices in which the manufacturing steps for the film patterned retarder is simplified and the productivity and the processing efficiency are enhanced.

In order to accomplish the above purpose, the present disclosure suggests a device for manufacturing a film patterned retarder comprising: a light source configured to irradiate an ultra violet light to an exposure area; a left polarizer and a right polarizer disposed in neighboring on a same leveled plane within the exposure area; a left pattern mask overlapping with the left polarizer and a right pattern mask overlapping with the right polarizer; and a film roller configured to rotate with a constant speed, to contact a base film on its surface and to move the base film with the constant speed.

The left polarizer and the right polarizer are disposed above the left pattern mask and the right pattern mask, respectively.

The left polarizer and the right polarizer are disposed under the left pattern mask and the right pattern mask, respectively.

The left polarizer and the left pattern mask is an embedded type further comprising: a transparent substrate; a left polarization pattern formed on a front surface of the transparent substrate; and the left mask pattern formed on a rear surface of the transparent substrate.

The left polarizer and the left pattern mask is an embedded type further comprising: a transparent substrate; a right polarization pattern formed on a front surface of the transparent substrate; and the right mask pattern formed on a rear surface of the transparent substrate.

The exposure area is overlapping with some portions of the film roller configure to closely contact some portion of the base film.

The left polarizer and the right polarizer have line patterns perpendicular each other.

The left polarizer has a left oblique line pattern aligned to +45 degree direction, and the right polarizer has a right oblique line pattern aligned to −45 degree direction.

The left pattern mask has a black and white pattern which is reversed to that of the right pattern mask.

The left pattern mask has a first pattern in which a left eye area is opened and a right eye area is blocked, and the right pattern mask has a second pattern in which the left eye area is blocked and the right eye is opened.

The exposure area has a width of 150 mm at least.

The film roller is configured to have a maximum difference of distances between the base film and the polarizer within the exposure area is less than 100 um.

The film roller has a radius of 300 mm at least.

The light source includes a short arc type lamp.

The left polarizer and the right polarizer are longitudinally attached each other on the same level plane.

The left pattern mask and the right pattern mask are longitudinally attached each other on the same level plane.

By providing the manufacturing method for a film type patterned retarder in which the left eye patterns and the right eye patterns are formed simultaneously, the manufacturing device has simple structure and the cost for configuring the manufacturing device and equipment is very low. Furthermore, the manufacturing process is very simple and the cost for manufacturing the film patterned retarder according to the present disclosure is saved. By performing the exposure process on the roller surface ensuring the film surface in even plane state, it is possible to get the fine pattern with nanometer scale in the higher production yield.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
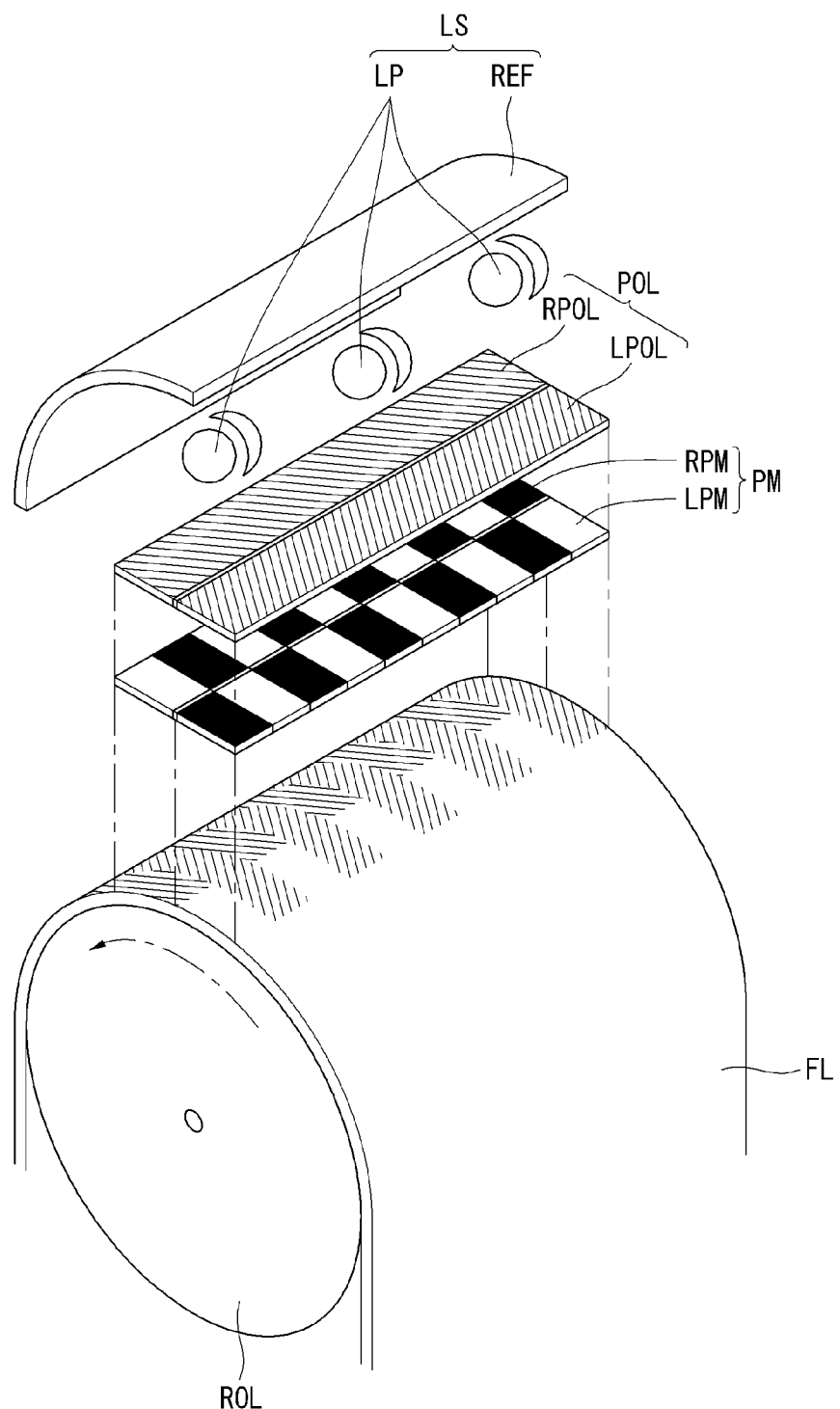
FIG. 1 is a perspective view illustrating the structure of a manufacturing device for the film type patterned retarder according to the present disclosure.

Advantages and features of the present invention and a method of achieving the advantages and the features will be apparent by referring to embodiments described below in detail in connection with the accompanying drawings. Hereinafter, referring to attached FIGS. 1 to 4, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 2:
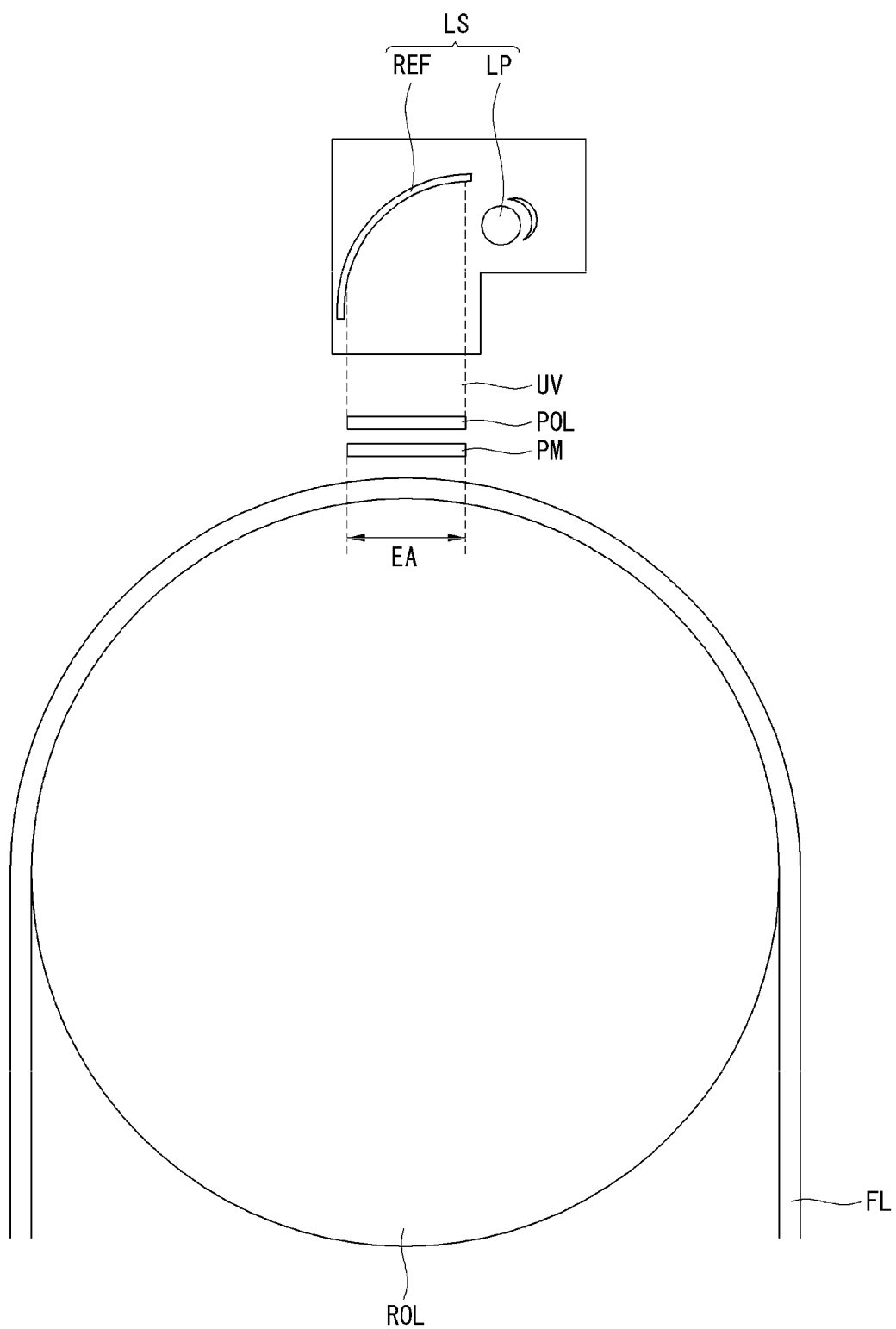
FIG. 2 is a cross-sectional view illustrating the structure of a manufacturing device for the film type patterned retarder according to the present disclosure.

FIG. 1 is a perspective view illustrating the structure of a manufacturing device for the film type patterned retarder according to the present disclosure. FIG. 2 is a cross-sectional view illustrating the structure of a manufacturing device for the film type patterned retarder according to the present disclosure. The shapes and the scales of each elements are not exact but for easiness for understanding the concepts of the present disclosure.

Referring to FIGS. 1 and 2, a manufacturing device for a film type patterned retarder comprises a light source LS, a polarizer POL, a pattern mask PM and a film roller ROL for transferring a base film FL of the patterned retarder. The light source LS irradiates the ultra violet light UV to the polarizer POL. The polarizer POL makes the ultra violet light UV to a polarized ultra violet light and radiates it to the pattern mask PM. The pattern mask PM passes the polarized ultra violet light within a defined area. The film roller ROL transfers the base film FL for forming the film patterned retarder along the surface of the film roller ROL with a constant speed as the film roller ROL rotates. As the base film FL is passing under the pattern mask PM, the area corresponding to the shape of the pattern mask PM is exposed to the polarized ultra violet light.

The light source LS may include a plurality of the short arc type lamp LP generating and irradiating the ultra violet light UV, and a reflector REF guiding the ultra violet light UV to the exposure area EA where the polarizer POL is disposed. The ultra violet light UV from the short arc type lamp LP is focused within the space for exposure operation by the reflector REF. Furthermore, a light guide means may be included for effective focusing of the ultra violet light UV to the exposure area EA. If required, for some examples, the reflector REF may not be included.

The space for exposure operation is corresponding to some surfaces of the film roller ROL. As the base film FL is closely contacted on the surface of the film roller ROL, the base film FL can be moved with a constant speed when the film roller ROL is rotating. In order to form a polarization pattern on the base film FL at the same time with the moving of the base film FL, the polarized ultra violet light may be focused on the some portions of the film roller ROL by the reflector REF.

Under the reflector REF and the over the base film FL contacting on the surface of the film roller ROL, the polarizer POL and the pattern mask PM are stacked and disposed. The polarizer POL and the pattern mask PM may be stacked and mounted by special equipment. Otherwise, the polarizer POL may have a pattern corresponding to the pattern mask PM on its surface.

When the pattern mask PM is located under the polarizer POL, the ultra violet light UV may be firstly polarized by the polarizer POL, and then the polarized ultra violet light may be irradiated to the area defined by the pattern mask PM. In other example, when the polarizer POL is located under the pattern mask PM, the ultra violet light UV may be irradiated to the area defined by the pattern mask PM firstly, and then the ultra violet light UV may be polarized by the polarizer POL. Hereinafter, we will explain about the present disclosure with the first case in which the pattern mask PM is located under the polarizer POL.

Especially, in the present disclosure, the polarizer POL may include a left polarizer LPOL for polarizing the left eye area of the base film FL of the patterned retarder to the left polarization direction, and a right polarizer RPOL for polarizing the right eye area of the base film FL to the right polarization direction. The left polarizer LPOL and the right polarizer RPOL may include a wire grid polarizer POL disposed in manner that they are neighboring on the same level plane. Therefore, under the left polarizer LPOL, the left pattern mask LPM is located for transprenting the left polarized ultra violet light (i.e., polarized ultra violet light to the left direction) to the left eye area, while the right pattern mask RPM is located under the right polarizer RPOL for transprenting the right polarized ultra violet light (i.e., polarized ultra violet light to the right direction) to the right eye area. In one example, the left pattern mask LPM may have the pattern in manner that the left eye areas are opened by the transparent patterns and the right eye areas are blocked by the black patterns. On the contrary, the right pattern mask RPM may have the pattern in manner that the right eye areas are opened by the transparent patterns and the left eye areas are blocked by the black patterns. That is, the left pattern mask LPM may have a black and white pattern which is reversed to that of the right pattern mask RPM.

As the film roller ROL is rotating, the base film FL contacting on the surface of the film roller ROL is moving. The base film FL may be passing under the left pattern mask LPM at first. Sequentially, the base film FL will be passing under the right pattern mask RPM. At that time, when the lamp LP turns on, the ultra violet light UV from the lamp LP is irradiated to the polarizer POL by the reflector REF. By the left polarizer LPOL of the polarizer POL, the ultra violet light UV will be polarized in the left direction, and the ultra violet light UV will be polarized in the right direction by the right polarizer RPOL of the polarizer POL. The left polarized ultra violet light is irradiated on the left eye area of the base film FL only by the left pattern mask LPM. Furthermore, the right polarized ultra violet light is irradiated on the right eye area of the base film FL only by the right pattern mask RPM.

As the base film FL is passing under the left pattern mask LPM at first, the base film FL may have the left polarization pattern on the left eye area, at first. After that, the base film FL is passing under the right pattern mask RPM so that the base film FL has the right polarization pattern on the right eye area, finally. As a result, the base film FL is formed as the film patterned retarder comprising the left eye area having the left polarization pattern and the right eye area having the right polarization pattern, after the base film FL is passing the film roller ROL at once.

Referring to FIG. 2 again, the base film FL for making the patterned retarder may be patterned to have the left polarization pattern and/or the right polarization pattern using the polarization pattern mask having line width and space of 10~50 nanometer (i.e., lines of 10~50 nm width is disposed with the spaces of 10~50 nm). Therefore, it is important for the base film FL to have uniformity in the plane condition when it is exposed to form the polarization pattern. In the present disclosure, when the base film FL is closely contacted on the surface of the film roller ROL, the base film FL has good and uniform plane condition. As well known in the FIG. 2, the film roller ROL has cylindrical shape, and as only some portion of the base film FL is closely contacted on the surface of the film roller ROL when the base film FL is moving by the film roller ROL the film. Therefore, it is very important to find and define the exposure area EA at which the polarization pattern by the exposure operation is uniformly formed.

Figure 3:
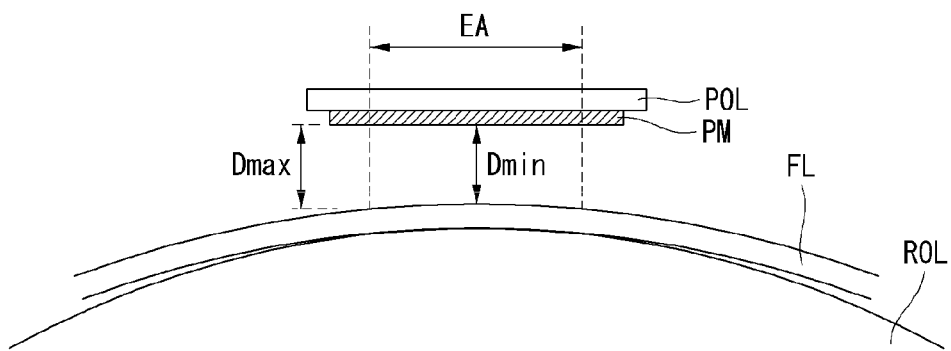
FIG. 3 is an enlarged cross-sectional view illustrating the effective exposure area and the exposure distance defined by the curvature of the roller in the manufacturing device for the film type patterned retarder according to the present disclosure.

The considerations to find and define the exposure area EA are as follows. FIG. 3 is an enlarged cross-sectional view illustrating the effective exposure area and the exposure distance defined by the curvature of the roller in the manufacturing device for the film type patterned retarder according to the present disclosure.

In one example, the radius of the film roller ROL may be 300 mm. At that time, considering the exposure efficiency, the deviation of the distances from the base film FL and the polarizer POL or the deviation of the distances from the base film FL and the pattern mask PM, within the exposure area EA may be less than 100 um (micrometer). Referring to FIG. 3, the distances between the base film FL and the pattern mask PM are not same within the exposure area EA. That is, the distance Dmax at the edge portion of the exposure area EA has the largest value, and the distance Dmin at the center portion of the exposure area EA has the smallest value. The difference between these distances (i.e., Dmax−Dmin) should be less than 100 um. To do so, the film roller ROL should have 300 mm radius at least. When the radius of the film roller ROL is larger than 300 mm, it is possible to define the width of the exposure area EA to have 150 mm at least. If the deviation of the distance (difference between Dmax and Dmin) is larger than 100 um, the exposure efficiency may be degraded so that the polarization pattern may not be uniformly formed over the exposure area EA.

In addition, the width of the film roller ROL may be corresponding to the width of the patterned retarder. As the patterned retarder may have the width corresponding to the width of the flat panel display device, the width of the film roller ROL may have the same width of the shorter side of the flat panel display device (when the polarization pattern is running along to the longer side).

In one example, the left polarizer LPOL and the right polarizer RPOL having a width of 80 mm and a length corresponding to the width of the film roller ROL, respectively are disposed on the same leveled plane. Under the left polarizer LPOL, the left pattern mask LPM corresponding to the shape and size of the left polarizer LPOL may be disposed. Like that, under the right polarizer RPOL, the right pattern mask RPM corresponding to the shape and size of the right polarizer RPOL may be disposed. Under the left pattern mask LPM and the right pattern mask RPM, the base film FL contacted on the surface of the film roller ROL of which radius is 300 mm at least is located.

As the film roller ROL is rotating, the base film FL contacting on the surface of the film roller ROL is moved under the left pattern mask LPM and the right pattern mask RPM with a constant speed. Sequentially, the left polarization pattern is formed on the left eye area and the right polarization pattern is formed on the right eye area. That is, as the base film FL is passing through the exposure system at once, the left eye area having the left polarization pattern and the right eye area having the right polarization pattern are simultaneously formed.

Until now, we explain about the case in which the polarizer POL and the pattern mask PM are separately prepared and they are assembled in manner that the pattern mask PM is disposed under the polarizer POL. However, if required, the pattern mask MP can be located above the polarizer POL.

The polarizer POL may be made by aligning the wire grid pattern on the transparent substrate such as the quartz glass. In one example, the left polarizer LPOL may have an left oblique line pattern having the inclined line pattern to +45 degree direction, and the right polarizer RPOL may have an right oblique line pattern having the inclined line pattern to −45 degree direction, or vice versa. The pattern mask PM may include a black film pattern disposed on the transparent substrate such as the quartz glass.

Figure 4:
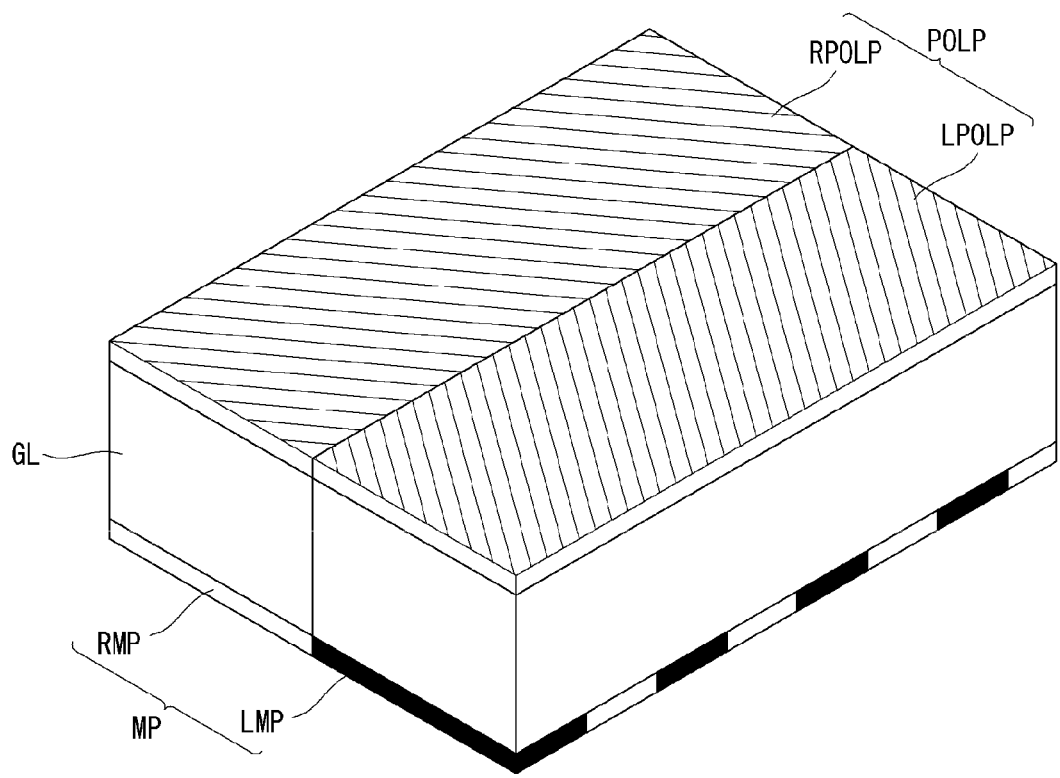
FIG. 4 is a perspective view illustrating an example of a polarizer embedding the mask pattern used for the manufacturing device of the film patterned retarder according to the present disclosure.

The polarizer POL and the pattern mask PM may be made of the quartz glass in order to ensure the transparency of the ultra violet light. However, when the polarizer POL and the pattern mask PM are stacked, the ultra violet light passes two transparent substrates. As a result, the transparency of the ultra violet light may be degraded and it may cause the lower exposure energy. Therefore, it is more preferable that the polarization pattern POLP and the mask pattern MP are embedded in one transparent substrate GL, as shown in FIG. 4. FIG. 4 is a perspective view illustrating an example of a polarizer embedding the mask pattern used for the manufacturing device of the film patterned retarder according to the present disclosure.

The polarizer embedding the mask pattern according to the present disclosure comprises a transparent substrate GL such as quartz glass, a polarization pattern POLP on the front surface of the transparent substrate GL, and a mask pattern MP on the rear surface of the transparent substrate GL. Especially, the polarizer embedding the mask pattern for forming the left polarization pattern and the right polarization pattern at the same time according to the present disclosure comprises a left polarization pattern LPOLP on one ½ area of the front surface of the transparent substrate GL, and a right polarization pattern RPOLP on the other ½ are of the front surface of the transparent substrate GL. In addition, on one ½ area of the rear surface of the transparent substrate GL corresponding to the left polarization pattern LPOLP, a left mask pattern LPM may be included. On the other ½ area of the rear surface of the transparent substrate GL corresponding to the right polarization pattern RPOLP, a right mask pattern RPM may be included.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A manufacturing device of a film patterned retarder comprising:
   a light source configured to irradiate an ultra violet light to an exposure area;
   a left polarizer and a right polarizer disposed in neighboring on a same leveled plane within the exposure area;
   a left pattern mask overlapping with the left polarizer and a right pattern mask overlapping with the right polarizer; and
   a film roller configured to rotate with a constant speed, to contact a base film on its surface and to move the base film with the constant speed.

2. The device according to the claim 1, wherein the left polarizer and the right polarizer are disposed above the left pattern mask and the right pattern mask, respectively.

3. The device according to the claim 1, wherein the left polarizer and the right polarizer are disposed under the left pattern mask and the right pattern mask, respectively.

4. The device according to the claim 1, wherein the left polarizer and the left pattern mask is an embedded type further comprising:
   a transparent substrate;
   a left polarization pattern formed on a front surface of the transparent substrate; and
   the left mask pattern formed on a rear surface of the transparent substrate.

5. The device according to the claim 1, wherein the left polarizer and the left pattern mask is an embedded type further comprising:
   a transparent substrate;
   a right polarization pattern formed on a front surface of the transparent substrate; and
   the right mask pattern formed on a rear surface of the transparent substrate.

6. The device according to the claim 1, wherein the exposure area is overlapping with some portions of the film roller configure to closely contact some portion of the base film.

7. The device according to the claim 1, wherein the left polarizer and the right polarizer have line patterns perpendicular each other.

8. The device according to the claim 1, wherein the left polarizer has a left oblique line pattern aligned to +45 degree direction, and the right polarizer has a right oblique line pattern aligned to −45 degree direction.

9. The device according to the claim 1, wherein the left pattern mask has a black and white pattern which is reversed to that of the right pattern mask.

10. The device according to the claim 1, wherein the left pattern mask has a first pattern in which a left eye area is opened and a right eye area is blocked, and the right pattern mask has a second pattern in which the left eye area is blocked and the right eye is opened.

11. The device according to the claim 1, wherein the exposure area has a width of 150 mm at least.

12. The device according to the claim 1, wherein the film roller is configured to have a maximum difference of distances between the base film and the polarizer within the exposure area is less than 100 um.

13. The device according to the claim 11, wherein the film roller has a radius of 300 mm at least.

14. The device according to the claim 1, wherein the light source includes a short arc type lamp.

15. The device according to the claim 1, wherein the left polarizer and the right polarizer are longitudinally attached each other on the same level plane.

16. The device according to the claim 1, wherein the left pattern mask and the right pattern mask are longitudinally attached each other on the same level plane.

* * * * *